United States Patent [19]

Ting

[11] Patent Number: 5,457,410
[45] Date of Patent: Oct. 10, 1995

[54] ARCHITECTURE AND INTERCONNECT SCHEME FOR PROGRAMMABLE LOGIC CIRCUITS

[75] Inventor: Benjamin S. Ting, Saratoga, Calif.

[73] Assignee: BTR, Inc., Reno, Nev.

[21] Appl. No.: 101,197

[22] Filed: Aug. 3, 1993

[51] Int. Cl.$^6$ .................................................. H03K 19/177
[52] U.S. Cl. .............................. 326/41; 326/39; 364/490
[58] Field of Search .......................... 307/465, 465.1; 364/488–490, 716; 326/39–41, 47

[56] References Cited

U.S. PATENT DOCUMENTS

| | | | |
|---|---|---|---|
| 4,020,469 | 4/1977 | Manning | 340/172.5 |
| 4,700,187 | 10/1987 | Furtek | 340/825.83 |
| 4,847,612 | 7/1989 | Kaplinsky | 307/465 |
| 4,870,302 | 9/1989 | Freeman | 307/465 |
| 4,918,440 | 4/1990 | Furtek | 340/825.83 |
| 4,935,734 | 6/1990 | Austin | 340/825.83 |
| 4,992,680 | 2/1991 | Benedetti et al. | 307/465 |
| 5,144,166 | 9/1992 | Camarota et al. | 307/465 |
| 5,243,238 | 9/1993 | Kean | 307/465.1 |
| 5,260,610 | 11/1993 | Pedersen et al. | 307/465 |

FOREIGN PATENT DOCUMENTS

| | | |
|---|---|---|
| 0415542 | 3/1991 | European Pat. Off. . |
| 2180382 | 3/1987 | United Kingdom . |
| 9208286 | 5/1992 | WIPO . |
| 9410754 | 5/1994 | WIPO . |

OTHER PUBLICATIONS

F. Zlotnick, P. Butler, W. Li, D. Tang, "A High Performance Fine–Grained Approach to SRAM Based FPGAs," Wescon '93 Conference Record, pp. 321–326, Sep. 28–30, 1993.
R. Cliff et al., "A Dual Granularity and Globally Interconnected Architecture for a Programmable Logic Device," IEEE 1993 Custom Integrated Circuits Conf., pp. 7.3.1–7.3.5 (May 9–12, 1993).
B. Britton et al., "Optimized Reconfigurable Cell Array Architecture for High–Performance Field Prgmble Gate Arrays," IEEE 1993 Custom Intgrtd Cir Conf., pp. 7.2.1–7.2.5 (May 9–12, 1993).
Xilinx, "The Programmable Gate Array Data Book," 1992.
Altera Corporation, Data Sheet, "Flex EPF81188 12,000–Gate Programmable Logic Device," Sep. 1992, ver. 1.
Minnick, R. C. "A Survey of Microcellular Research," Journal of the Association for Computing Machinery, vol 14, No. 2, Apr. 1967, pp. 203–241.
Shoup, R. G., "Programmable Cellular Logic Arrays," Ph.D. dissertation, Carnegie–Mellon University, Pittsburg, Pa., Mar. 1970—Partial.
Spandorfer, L. M., "Synthesis of Logic Function on an Array of Integrated Circuits," UNIVAC, Division of Sperry Rand Corporation, Blue Bell, Pa., Contract AF 19(628)2907, AFCRL 66–298, Project No. 4645, Task No. 464504, Nov. 30, 1965.

Primary Examiner—David R. Hudspeth
Assistant Examiner—Jon Santamauro
Attorney, Agent, or Firm—Blakely, Sokoloff, Taylor & Zafman

[57] ABSTRACT

An architecture and distributed hierarchical interconnect scheme for field programmable gate arrays (FPGAs). The FPGA is comprised of a number of cells which perform logical functions on input signals. Programmable intraconnections provide connectability between each output of a cell belonging to a logical cluster to at least one input of each of the other cells belonging to that logical cluster. A set of programmable block connectors are used to provide connectability between logical clusters of cells and accessibility to the hierarchical routing network. An uniformly distributed first layer of routing network lines is used to provide connections amongst sets of block connectors. An uniformly distributed second layer of routing network lines is implemented to provide connectability between different first layers of routing network lines. Switching networks are used to provide connectability between the block connectors and routing network lines corresponding to the first layer. Other switching networks provide connectability between the routing network lines corresponding to the first layer to routing network lines corresponding to the second layer. Additional uniformly distributed layers of routing network lines are implemented to provide connectability between different prior layers of routing network lines.

40 Claims, 11 Drawing Sheets

ARCHITECTURE AND INTERCONNECT SCHEME FOR PROGRAMMABLE LOGIC CIRCUITS

FIELD OF THE INVENTION

The present invention pertains to the field of programmable logic circuits. More particularly, the present invention relates to an architecture and interconnect scheme for programmable logic circuits.

BACKGROUND OF THE INVENTION

When integrated circuits (ICs) were first introduced, they were extremely expensive and were limited in their functionality. Rapid strides in semiconductor technology have vastly reduced the cost while simultaneously increased the performance of IC chips. However, the design, layout, and fabrication process for a dedicated, custom built IC remains quite costly. This is especially true for those instances where only a small quantity of a custom designed IC is to be manufactured. Moreover, the turn-around time (i.e., the time from initial design to a finished product) can frequently be quite lengthy, especially for complex circuit designs. For electronic and computer products, it is critical to be the first to market. Furthermore, for custom ICs, it is rather difficult to effect changes to the initial design. It takes time, effort, and money to make any necessary changes.

In view of the shortcomings associated with custom IC's, field programmable gate arrays (FPGAs) offer an attractive solution in many instances. Basically, FPGAs are standard, high-density, off-the-shelf ICs which can be programmed by the user to a desired configuration. Circuit designers first define the desired logic functions, and the FPGA is programmed to process the input signals accordingly. Thereby, FPGA implementations can be designed, verified, and revised in a quick and efficient manner. Depending on the logic density requirements and production volumes, FPGAs are superior alternatives in terms of cost and time-to-market.

A typical FPGA essentially consists of an outer ring of I/O blocks surrounding an interior matrix of configurable logic blocks. The I/O blocks residing on the periphery of an FPGA are user programmable, such that each block can be programmed independently to be an input or an output and can also be tristatable. Each logic block typically contains programmable combinatorial logic and storage registers. The combinatorial logic is used to perform boolean functions on its input variables. Often, the registers are loaded directly from a logic block input, or they can be loaded from the combinatorial logic.

Interconnect resources occupy the channels between the rows and columns of the matrix of logic blocks and also between the logic blocks and the I/O blocks. These interconnect resources provide the flexibility to control the interconnection between two designated points on the chip. Usually, a metal network of lines run horizontally and vertically in the rows and columns between the logic blocks. Programmable switches connect the inputs and outputs of the logic blocks and I/O blocks to these metal lines. Crosspoint switches and interchanges at the intersections of rows and columns are used to switch signals from one line to another. Often, long lines are used to run the entire length and/or breadth of the chip.

The functions of the I/O blocks, logic blocks, and their respective interconnections are all programmable. Typically, these functions are controlled by a configuration program stored in an on-chip memory. The configuration program is loaded automatically from an external memory upon power-up, on command, or programmed by a microprocessor as part of system initialization.

The concept of FPGA was summarized in the sixty's by Minnick who described the concept of cell and cellular array as reconfigurable devices in the following documents: Minnick, R. C. and Short, R. A., "Cellular Linear-Input Logic, Final Report," SRI Project 4122, Contract AF 19(628)-498, Stanford Research Institute, Menlo Park, Calif., AFCRL 64-6, DDC No. AD 433802 (February 1964); Minnick, R. C., "Cobweb Cellular Arrays," Proceedings AFIPS 1965 Fall Joint Computer Conference, Vol. 27, Part 1 pp. 327–341 (1965); Minnick, R. C. et al., "Cellular Logic, Final Report," SRI Project 5087, Contract AF 19(628)- 4233, Stanford Research Institute, Menlo Park, Calif., AFCRL 66-613, (April 1966); and Minnick, R. C., "A Survey of Microcellular Research," Journal of the Association for Computing Machinery, Vol. 14, No. 2, pp. 203–241 (April 1967). In addition to memory based (e.g., RAM-based, fuse-based, or antifuse-based) means of enabling interconnects between devices, Minnick also discussed both direct connections between neighboring cells and use of busing as another routing technique. The article by Spandorfer, L. M., "Synthesis of Logic Function on an Array of Integrated Circuits," Stanford Research Institute, Menlo Park, Calif., Contract AF 19(628)2907, AFCRL 64-6, DDC No. AD 433802 (November 1965), discussed the use of complementary MOS bi-directional passgate as a means of switching between two interconnect lines that can be programmed through memory means and adjacent neighboring cell interconnections. In Wahlstrom, S. E., "Programmable Logic Arrays—Cheaper by the Millions," Electronics, Vol. 40, No. 25 , 11, pp. 90–95 (December 1967), a RAM-based, reconfigurable logic array of a two-dimensional array of identical cells with both direct connections between adjacent cells and a network of data buses is described.

Shoup, R. G., "Programmable Cellular Logic Arrays," Ph.D. dissertation, Carnegie-Mellon University, Pittsburgh, Pa. (March 1970), discussed programmable cellular logic arrays and reiterates many of the same concepts and terminology of Minnick and recapitulates the array of Wahlstrom. In Shoup's thesis, the concept of neighbor connections extends from the simple 2-input 1-output nearest-neighbor connections to the 8-neighbor 2-way connections. Shoup further described use of bus as part of the interconnection structure to improve the power and flexibility of an array. Buses can be used to route signals over distances too long, or in inconvenient directions, for ordinary neighbor connections. This is particularly useful in passing inputs and outputs from outside the array to interior cells. U.S. Pat. No. 4,020,469 discussed a programmable logic array that can program, test, and repair itself. U.S. Pat. No. 4,870,302 introduced a coarse grain architecture without use of neighbor direct interconnections where all the programmed connections are through the use of three different sets of buses in a channeled architecture. The coarse grain cell (called a Configurable Logical block or CLB) contains both RAM-based logic table look up combinational logic and flip flops inside the CLB where a user defined logic must be mapped into the functions available inside the CLB. U.S. Pat. No. 4,935,734 introduced a simple logic function cell defined as a NAND, NOR or similar types of simple logic function inside each cell. The interconnection scheme is through direct neighbor and directional bus connections. U.S. Pat. Nos. 4,700,187 and 4,918,440 defined a more complex logic function cell where an Exclusive OR and AND functions and a register bit is available and selectable within the cell. The preferred connection scheme is through direct neighbor connections. Use of bi-direction buses as connections were also included.

Current FPGA technology has a few shortcomings. These problems are embodied by the low level of circuit utilization given the vast number of transistors available on chip provided by the manufacturers. Circuit utilization is influenced by three factors. The first one at the transistor or fine grain cell level is the function and flexibility of the basic logic element that can be readily used by the users. The second one is the ease in which to form meaningful macro logic functions using the first logic elements with minimum waste of circuit area. The last factor is the interconnections of those macro logic functions to implement chip level design efficiently. The fine grained cell architectures such as those described above, provided easily usable and flexible logical functions for designers at the base logic element level.

However, for dense and complex macro functions and chip level routing, the interconnection resources required to connect a large number of signals from output of a cell to the input(s) of other cells can be quickly exhausted, and adding these resources can be very expensive in terms of silicon area. As a consequence, in fine grained architecture design, most of the cells are either left unused due to inaccessibility, or the cells are used as interconnect wires instead of logic. This adds greatly to routing delays in addition to low logic utilization, or excessive amount of routing resources are added, greatly increasing the circuit size. The coarse grain architecture coupled with extensive routing buses allows significant improvements for signals connecting outputs of a CLB to inputs of other CLBs. The utilization at the CLB interconnect level is high. However, the difficulty is the partitioning and mapping of complex logic functions so as to exactly fit into the CLBs. If a part of logic inside the CLB is left unused, then the utilization (effective number of gates per unit area used) inside the CLB can be low.

Another problem with prior art FPGAs is due to the fact that typically a fixed number of inputs and a fixed number of outputs are provided for each logic block. If, by happenstance, all the outputs of a particular logic block is used up, then the rest of that logic block becomes useless.

Therefore, there is a need in prior art FPGAs for a new architecture that will maximize the utilization of an FPGA while minimizing any impact on the die size. The new architecture should provide flexibility in the lowest logic element level in terms of functionality and flexibility of use by users, high density per unit area functionality at the macro level where users can readily form complex logic functions with the base logic elements, and finally high percentage of interconnectability with a hierarchical, uniformly distributed routing network for signals connecting macros and base logic elements at the chip level. Furthermore, the new architecture should provide users with the flexibility of having the number of inputs and outputs for individual logical block be selectable and programmable, and a scalable architecture to accommodate a range of FPGA sizes.

SUMMARY OF THE INVENTION

The present invention relates to an architecture of logic and connection scheme for programmable logic circuits, such as those for field programmable gate arrays (FPGAs). The programmable logic circuit is comprised of a number of cells which perform digital functions on input signals. Depending on user's specific design, certain cells are programmably interconnected to a particular configuration for realizing the desired logic functions.

In the currently preferred embodiment, four logic cells (four two-input one-output logic gates and one D flip-flop) form a logical cluster (i.e. a 2×2 cell array) and four sets of clusters form a logical block (i.e. a 4×4 cell array). Within each cluster, there is a set of five intraconnection lines, called Intraconnection Matrix (I-Matrix), one associated with the output of each one of the four gates and the D flip-flop that is connectable to the input of the other cells. Within each logical block, the I-Matrix within each cluster can be extended to an adjacent cluster through a passgate to form connections within the logical block (to extend the intraconnection range ). Inside each logical block, there is an associated set of access lines called Block Connectors (BCs). The block connectors provide access to and connectability between the various cells of that same logical block. In other words, each input and output of each of the cells of a logical block is capable of being connected to a set of block connectors corresponding to that logical block. With the judicious use of I-Matrix and block connectors within the same logical block, a set of signals can be internally connected without using any resources outside the logical block. A number of programmable switches are used to control which of the block connectors are to be connected together to a set of inputs and/or outputs of the cells inside the logical block for external access connecting to signals outside the current logical block. In other words, the input and/or output pins inside a logical block that are to be externally connected outside of the current logical block are accessed or connected through block connectors within the current logical block.

In order to route signals between the various logical blocks, a uniformly distributed multiple level architecture (MLA) routing network is used to provide connectability between each of the individual sets of block connectors. Programmable switches are implemented to control which of the first level MLA routing network lines are to be connected together. Additional programmable switches are used to control which of the block connectors are to be connected to specific first level MLA routing lines. For example, the switches can be programmed to allow an originating cell belonging to one logical block to be connected to a destination cell belonging to a different logical block. This can be accomplished by connecting the originating cell through one or more of its block connectors, onto the first level MLA, depending on the distance, other level(s) of MLA, and down through descending levels of MLAs back to the first level MLA, and finally through the block connector of the destination cell. Thereby, the block connectors and first level of MLA routing network provide interconnectability for an 8×8 cell array, called a block cluster.

In the present invention, larger cell arrays can be interconnected by implementing additional levels of MLA routing networks. For example, connectability for a 16×16 cell array, called a block sector, can be achieved by implementing a second level of MLA routing network lines to provide connectability between the various first level of MLA routing lines thereby making connections between different block clusters. Each level of MLA has a corresponding number of switches for providing programmable interconnections of the routing network of that level. Additional switching exchange networks are used to provide connectability between the various levels of MLAs.

In one embodiment, switches are used to provide connectability between two different sets of block connectors. Moreover, switches can be included to provide connectability between different sets of MLA routing lines of a particular level of MLAs. This provides for increased routing flexibility.

In the present invention, all MLA routing network lines are bi-directional. The switches are comprised of programmable bi-directional passgates. For increased number of levels, drivers may be necessary for providing the necessary switching speed for driving the routing lines, passgates, and associated loads, etc. In one embodiment, switches are used to provide programmable connectability amongst various sets of block connectors. Additional switches can be implemented to provide programmable connectability amongst various sets of the first level of MLA. This scheme can be repeated for higher levels of MLAs.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
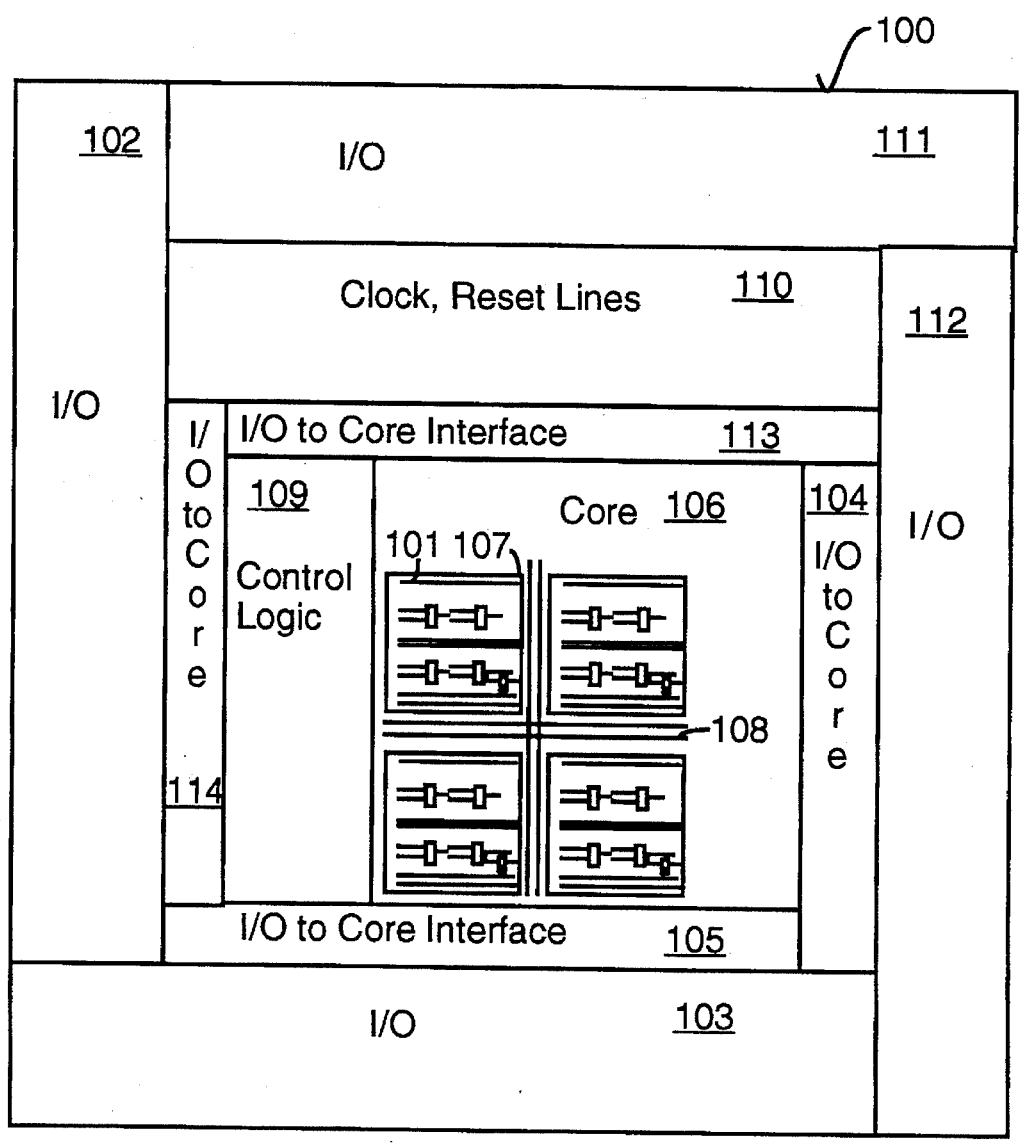
FIG. 1 is a block diagram of a field programmable gate array logic upon which the present invention may be practiced.

An architecture and interconnect scheme for programmable logic circuits is described. In the following description, for purposes of explanation, numerous specific details are set forth, such as combinational logic, cell configuration, numbers of cells, etc., in order to provide a thorough understanding of the present invention. It will be obvious, however, to one skilled in the art that the present invention may be practiced without these specific details. In other instances, well-known structures and devices are shown in block diagram form in order to avoid unnecessarily obscuring the present invention. It should also be noted that the present invention pertains to a variety of processes including but not limited to static random access memory (SRAM), dynamic random access memory (DRAM), fuse, anti-fuse, erasable programmable read only memory (EPROM), electrically erasable programmable read only memory (EEPROM), FLASH, and ferroelectric processes. Referring to FIG. 1, a block diagram of a field programmable gate array logic upon which the present invention may be practiced is shown as 100. The I/O logical blocks 102, 103, 111 and 112 provide an interface between external package pins of the FPGA and the internal user logic either directly or through the I/O to Core interface 104, 105, 113, and 114. Four interface blocks 104, 105, 113, and 114 provide decoupling between core 106 and the I/O logic 102, 103, 111, and 112. Core 106 is comprised of a number of clusters 107 which are intraconnected by I-Matrix 101 and interconnected by MLA routing network 108.

Control/programming logic 109 is used to control all of the bits for programming the bit and word lines. For anti-fuse or fuse technology, high voltage/current is applied to either zap or connect a fuse. For EEPROM, Flash, or ferroelectric technology, there is an erase cycle followed by a programming cycle for programming the logic states of the memory bits. In order to minimize skewing, a separate clock/reset logic 110 is used to provide clock and reset lines on a group basis.

Figure 2A:
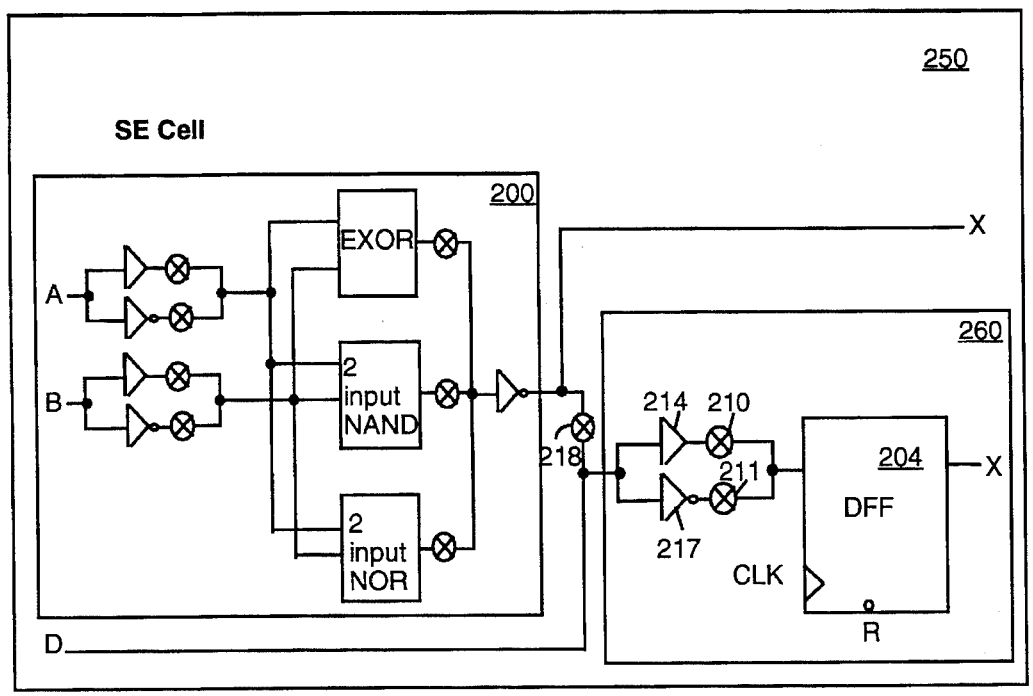
FIG. 2A shows one example of an individual cell.
Figure 2B:
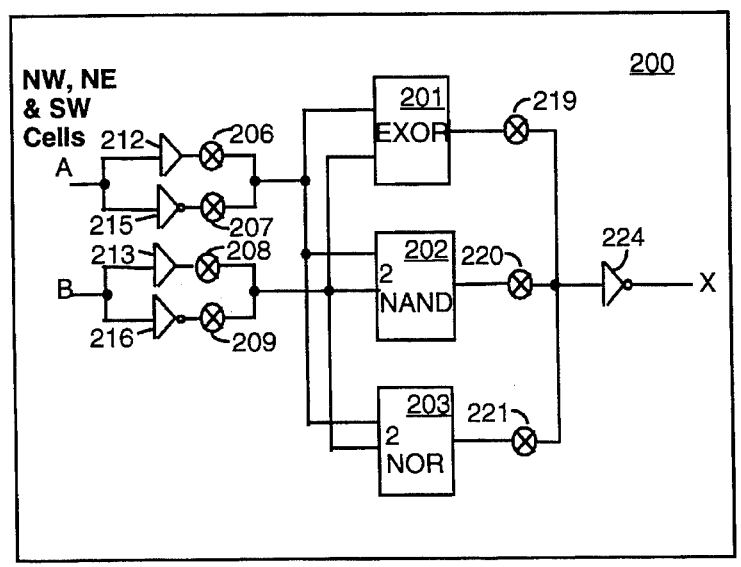
FIG. 2B shows another example of an individual cell.

In the currently preferred embodiment, each of the clusters 107 is comprised of a 2×2 hierarchy of four cells, called a logical cluster. FIGS. 2A and 2B show examples of individual cells 200 and 250. Cell 200 performs multiple logic functions on two input signals (A and B) and provides an output signal X. In the currently preferred embodiment, cell 200 is comprised of an XOR gate 201, a two-input NAND gate 202, and a two-input NOR gate 203. It should be noted, however, that in other embodiments, cell 200 can include various other types and/or combinations of gates. Cell 250 is comprised of cell 200 coupled with a D flip flop cell 260. The output X of cell 200 can be programmed to connect directly to the data input D of the D flip flop gate 204 by activating switch 218. The data input D can be accessed as a third input of the combined cell 250. Each of the two input signals A and B and the D input of D flip-flop can be inverted or non-inverted, depending on the states of switches 206–211. Activating switches 206, 208 and 210 causes signals A, B and D to be driven by drivers 212–214 to gates 201–204 in a non-inverted fashion. Activating switches 207, 209, and 211 causes the input signals A, B and D to be inverted by inverters 215–217 before being passed to gates 201–204. The six switches 212–217 can individually be turned on and off as programmed by the user.

Note that the XOR gate 201, NAND gate 202, and NOR gate 203 can also be used to perform XNOR, AND and OR by propagating the output signal to the next stage, whereby the signal can be inverted as discussed above.

Three switches 219–221 are respectively coupled to the outputs of the three gates 201–203. Again, these switches are programmable by the user. Thereby, the user can specify which of the outputs from the gates 201–203 is to be sent to driver 224 as the output X from cell 200.

The aforementioned switches 206–211, 218–221 are comprised of bi-directional, program-controlled passgates. Depending on the state of the control signal, the switches are either conducting (i.e. passes a signal on the line) or non-conducting (i.e. does not pass the signal on the line). Switches mentioned in the following sections are similarly comprised of program-controlled passgates.

Figure 3A:
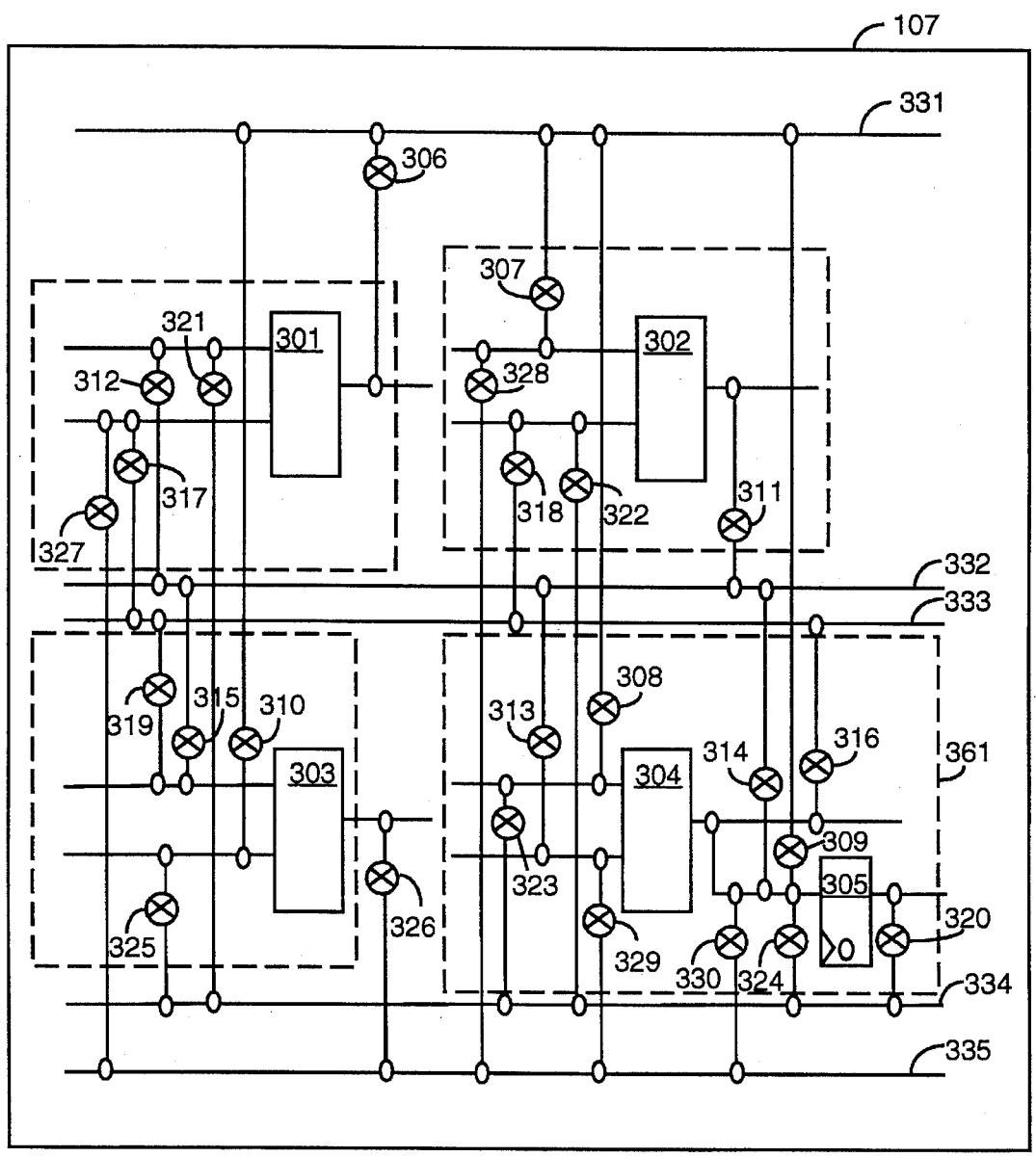
FIG. 3A shows a logical cluster.

Referring now to FIG. 3A, a logical cluster 107 is shown. In the currently preferred embodiment, logical cluster 107 is comprised of four cells 301–304 and a D flip-flop 305, twenty five switches 306–330, and five intraconnection lines 331–335. D flip flop 305 and cell 304 form a cell 361, such as cell 250 described with respect to FIG. 2a. The Intraconnection lines 331–335 and switches 306–330 form the I-Matrix. I-Matrix provide connectability of the output, X, of each of the four cells 301–304, and the output X of the D flip-flop 305 to at least one input of each of the other three cells and the D flip-flop. For example, the output X of cell 301 can be connected to input A of cell 302 by enabling switches 306 and 307. Likewise, the output X of cell 301 can be connected to input B of cell 303 by enabling switches 306 and 310. Output X of cell 301 can be connected to input A of cell 304 by enabling switches 306 and 308. Output X of cell 301 can be connected to input D of the D flip-flop cell 305 by enabling switches 306 and 309.

Similarly, the output X from cell 302 can be connected to input A of cell 301 by enabling switches 311 and 312. The output X from cell 302 can be connected to input A of cell 303 by enabling switches 311 and 315. The output X from cell 302 can be connected to input B of cell 304 by enabling switches 311 and 313. Output X of cell 302 can be connected to input D of the D flip-flop cell 305 by enabling switches 311 and 314.

Similarly, the output X from cell 303 can be connected to input B of cell 301 by enabling switches 326 and 327. The output X from cell 303 can be connected to input A of cell 302 by enabling switches 326 and 328. The output X from cell 303 can be connected to input B of cell 304 by enabling switches 326 and 329. Output X of cell 303 can be connected to input D of the D flip-flop cell 305 by enabling switches 326 and 330.

For cell 304, the output X from cell 304 can be connected to input B of cell 301 by enabling switches 316 and 317. The output X from cell 304 can be connected to input B of cell 302 by enabling switches 316 and 318. The output X from cell 304 can be connected to input A of cell 303 by enabling switches 316 and 319. Output X of cell 304 can be programmably connected to input D of the D flip-flop cell 305 by enabling switch 218 in FIG. 2A.

With respect to cell 305, its output is connectable to the A input of cell 301 by enabling switches 320 and 321; the B input of cell 302 by enabling switches 320 and 322; the B input of cell 303 by enabling switches 320 and 325; the A input of cell 304 by enabling switches 320 and 323; and the D input of cell 305 itself by enabling switches 320 and 324.

It can be seen that each output of the cells 301–304 and of the D flip-flop 305 is connectable to the input of each of its neighboring cells and/or flip-flop inside the cluster.

Figure 3B:
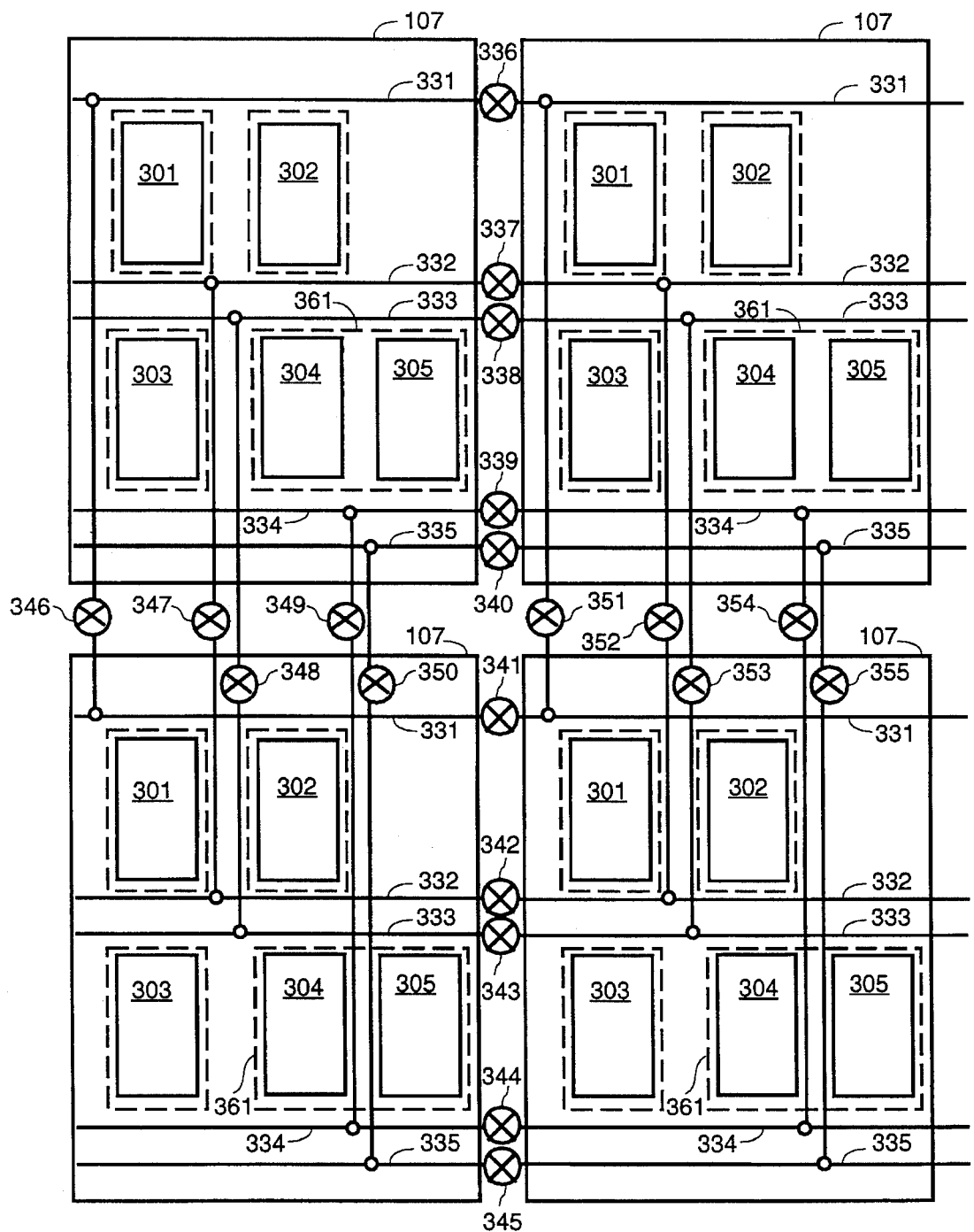
FIG. 3B shows the extension of I-matrix intraconnections of a logical cluster to a neighboring logical cluster.

In the currently preferred embodiment of the present invention, each logical cluster is connectable to all the other logical clusters inside each logical block through passgate switches extending the I-Matrix from neighboring clusters inside each logical block. FIG. 3B illustrates the extension of I-Matrix intraconnection lines 331–335 of the cells 301–304 and the D flip-flop 305 of a logical cluster 107 to a neighboring logical cluster 107 through the passgate switches 336–355 within the same logical block.

In the currently preferred embodiment of the present invention, each logical block is connectable to all the other logical blocks of the FPGA. This is accomplished by implementing an architecture with multiple layers of interconnections. It is important to note that this multiple layers routing architecture is a conceptual hierarchy, not a process or technology hierarchy and is hence readily implementable with today's silicon process technology. The bottom most layer of interconnections is referred to as the "block connectors". A set of block connectors provides the access and interconnections of signals within an associated logical block (which is consisted of four logical clusters or 16 cells). Thereby, different sets of logical clusters within the same logical block are connectable to any of the other logical clusters within that group through the use of extended I-Matrix and/or block connectors. Again, programmable bi-directional passgates are used as switches to provide routing flexibility to the user.

The next level of connections is referred to as the "level 1 Multiple Level Architecture (MLA)" routing network. The level 1 MLA routing network provides the interconnections between several sets of block connectors. Programmable passgates switches are used to provide users with the capability of selecting which of the block connectors are to be connected. Consequently, a first logical block from one set of logical block groups is connectable to a second logical block belonging to the same group. The appropriate switches are enabled to connect the block connectors of the first logical block to the routing lines of the level 1 MLA routing network. The appropriate switches of the level 1 MLA routing network are enabled to provide the connections to the block connectors of the second logical block to the routing lines of the level 1 MLA routing network. The appropriate switches are enabled to connect the routing lines of the level 1 MLA routing network that connected to the block connectors of the first and the second logical blocks. Furthermore, the user has the additional flexibility of programming the various switches within any given logical block to effect the desired intraconnections between each of the cells of any logical block.

The next level of connections is referred to as the "level 2 Multiple Level Architecture (MLA)" routing network. The level 2 MLA provides the interconnections to the various level 1 MLA to effect access and connections of a block cluster. Again, bi-directional passgate switches are programmed by the user to effect the desired connections. By implementing level 2 MLA routing network, programmable interconnections between even larger numbers of logical blocks is achieved.

Additional levels of MLA routing networks can be implemented to provide programmable interconnections for ever increasing numbers and groups of logical blocks, block clusters, block sectors, etc. Basically, the present invention takes a three dimensional approach for implementing routing. Signals are routed amongst the intraconnections of a logical block. These signals can then be accessed through block connectors and routed according to the programmed connections of the block connectors. If needed, signals are "elevated" to the level 1 MLA, routed through the level 1 MLA routing network, "de-elevated" to the appropriate block connectors, and then passed to the destination logical block.

If level 2 MLA routing network is required, some of the signals are elevated a second time from a level 1 MLA routing network line to the level 2 MLA routing network, routed to a different set of level 2 MLA routing network line, and "de-elevated" from the level 2 MLA routing network line to a Level 1 MLA routing network line. Thereupon, the signals are "de-elevated" a second time to pass the signal from the level 1 MLA to the appropriate block connectors of the destination logical block. This same approach is performed for level 3, 4, 5, etc. MLAs on an as needed basis, depending on the size and density of the FPGA. Partial level n MLA can be implemented using the above discussed method to implement a FPGA with a given cell array count.

Figure 4A:
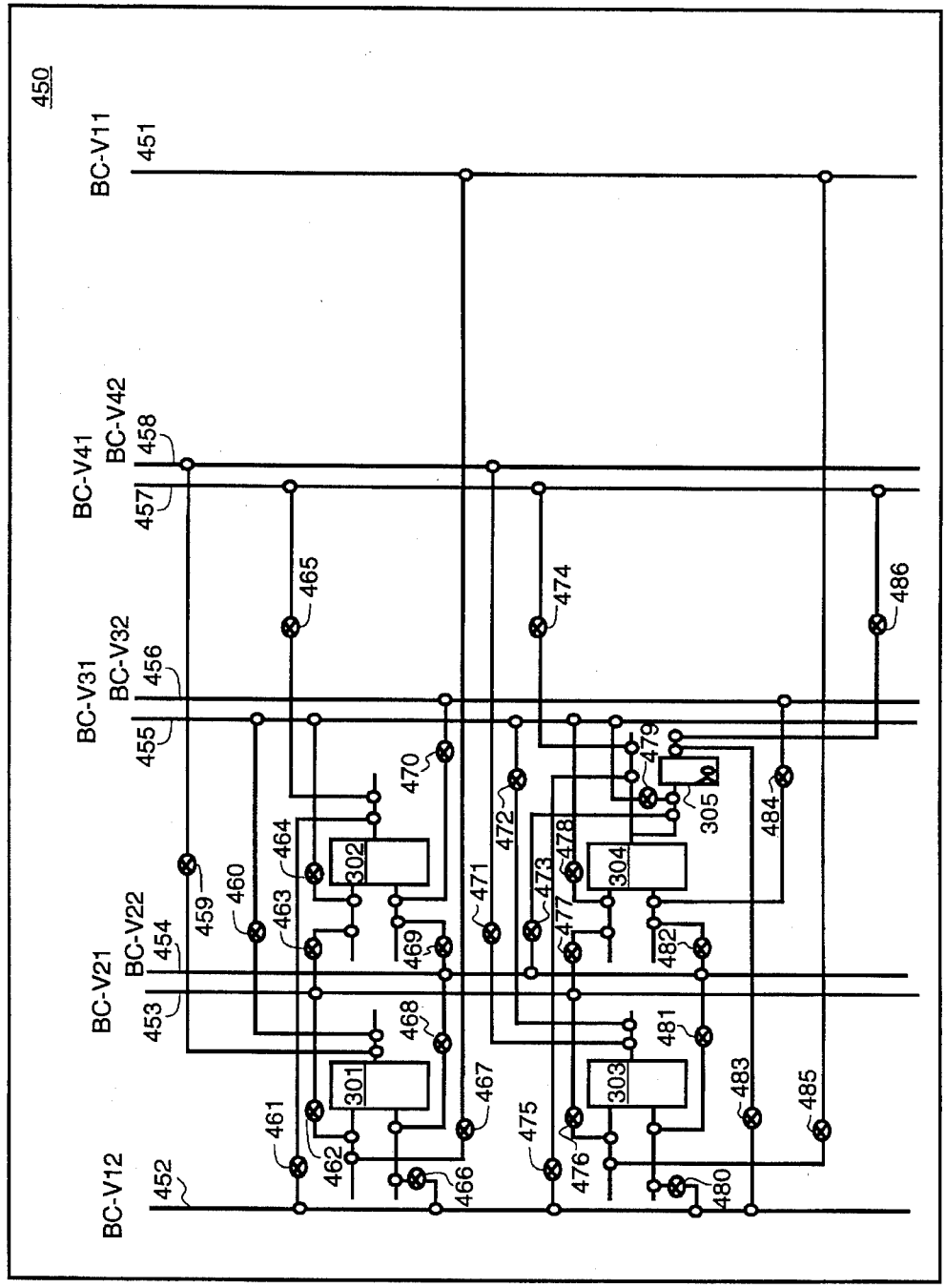
FIG. 4A shows an example of a logical cluster with vertical block connectors.

FIG. 4A shows an example of a logical cluster and the associated vertical block connectors within the logical block. In the currently preferred embodiment, each cell in a logical cluster is accessible from the input by two vertical block connectors and each output of the cell in a logical cluster is accessible to two of the vertical block connectors. For example, input A of cell 301 is accessible to the vertical block connectors 451 (BC-V11) and 453 (BC-V21) through switches 467, 462 respectively, input B of cell 301 is accessible to the vertical block connectors 452 (BC-V12) and 454 (BC-V22) through switches 466, 468 respectively, output X of cell 301 is accessible to the vertical block connectors 455 (BC-V31) and 458 (BC-V42) through switches 460, 459 respectively. Input A of cell 302 is accessible to the vertical block connectors 453 (BC-V21) and 455 (BC-V31) through switches 463, 464 respectively, input B of cell 302 is accessible to the vertical block connectors 454 (BC-V22) and 456 (BC-V32) through switches 469, 470 respectively, output X of cell 302 is accessible to the vertical block connectors 452 (BC-V12) and 457 (BC-V41) through switches 461, 465 respectively. Input A of cell 303 is accessible to the vertical block connectors 451 (BC-V11) and 453 (BC-V21) through switches 485, 476 respectively, input B of cell 303 is accessible to the vertical block connectors 452 (BC-V12) and 454 (BC-V22) through switches 480, 476 respectively, output X of cell 303 is accessible to the vertical block connectors 455 (BC-V31) and 458 (BC-V42) through switches 472, 471 respectively. The input A of cell 304 is accessible to the vertical block connectors 453 (BC-V21) and 455 (BC-V31) through switches 477, 478 respectively, input B of cell 304 is accessible to the vertical block connectors 454 (BC-V22) and 456 (BC-V32) through switches 482, 484 respectively, output X of cell 304 is accessible to the vertical block connectors 452 (BC-V12) and 457 (BC-V41) through switches 475, 474 respectively. D flip-flop cell 305 input is accessible to the vertical block connectors 454 (BC-V22) and 455 (BC-V31) through switches 473, 479 respectively, output X of cell 305 is accessible to the vertical block connectors 452 (BC-V12) and 457 (BC-V41) through switches 483, 486 respectively.

Figure 4B:
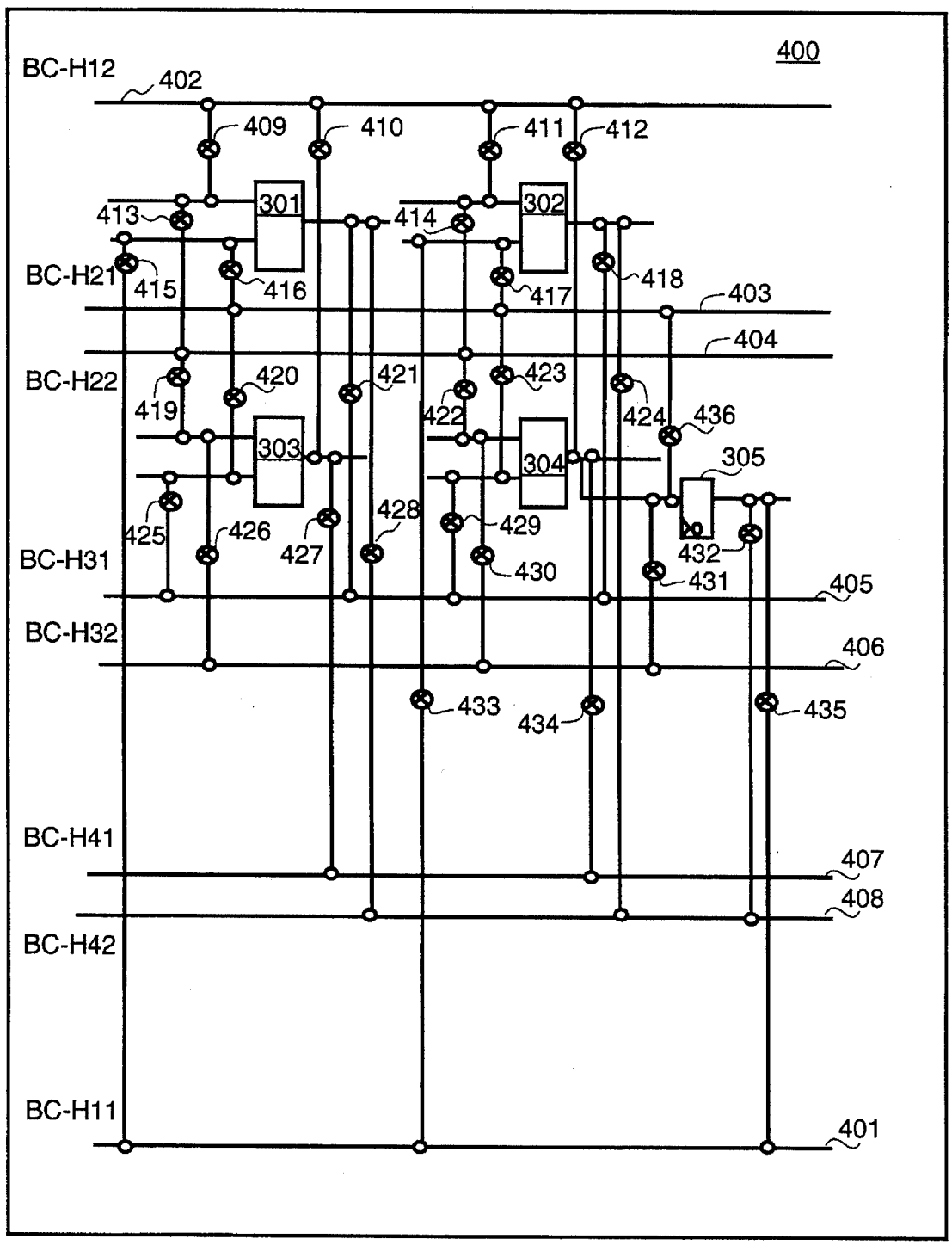
FIG. 4B shows an example of a logical cluster with horizontal block connectors.

In similar fashion, FIG. 4B shows the possible connections corresponding to horizontal block connectors and the logical cluster shown in FIG. 4A. Input A of cell 301 is accessible to the horizontal block connectors 402 (BC-H12) and 404 (BC-H22) through switches 409, 413 respectively, input B of cell 301 is accessible to the horizontal block connectors 401 (BC-H11) and 403 (BC-H21) through switches 415, 416 respectively, output X of cell 301 is accessible to the horizontal block connectors 405 (BC-H31) and 408 (BC-H42) through switches 421, 428 respectively. Input A of cell 302 is accessible to the horizontal block connectors 402 (BC-H12) and 404 (BC-H22) through switches 411, 414 respectively, input B of cell 302 is accessible to the horizontal block connectors 401 (BC-H11) and 403 (BC-H21) through switches 433, 417 respectively, output X of cell 302 is accessible to the horizontal block connectors 405 (BC-H31) and 408 (BC-H42) through switches 418, 424 respectively. Input A of cell 303 is accessible to the horizontal block connectors 404 (BC-H22) and 406 (BC-H32) through switches 419, 426 respectively, input B of cell 303 is accessible to the horizontal block connectors 403 (BC-H21) and 405 (BC-H31) through switches 420, 425 respectively, output X of cell 303 is accessible to the horizontal block connectors 402 (BC-H12) and 407 (BC-H41) through switches 410, 427 respectively. The input A of cell 304 is accessible to the horizontal block connectors 404 (BC-H22) and 406 (BC-H32) through switches 422, 430 respectively, input B of cell 304 is accessible to the horizontal block connectors 403 (BC-H21) and 405 (BC-H31) through switches 423, 429 respectively, output X of cell 304 is accessible to the horizontal block connectors 402 (BC-H12) and 407 (BC-H41) through switches 412, 434 respectively. D flip-flop cell 305 input is accessible to the horizontal block connectors 403 (BC-H21) and 406 (BC-H32) through switches 436, 431 respectively, output X of cell 305 is accessible to the horizontal block connectors 401 (BC-H11) and 408 (BC-H42) through switches 432, 435 respectively.

FIGS. 4A and 4B illustrate the vertical and horizontal block connectors accessing method to the upper left (NW) logical cluster inside a logical block in the currently preferred embodiment. The lower left (SW) cluster has the identical accessing method to the vertical block connectors as those of the NW cluster. The upper right (NE) cluster has similar accessing method to those of the NW cluster with respect to the vertical block connectors except the sequence of vertical block connector access is shifted. The vertical block connectors 451–458 can be viewed as chained together as a cylinder (451, 452, . . . , 458). Any shift, say by 4, forms a new sequence: (455, 456, 457, 458, 451, 452, 453, 454). Instead of starting with vertical block connectors 451 and 453 accessing by cell 301 in the NW cluster as illustrated in FIGS. 4A, the cell 301 in the NE cluster is accessible to VBCs 455 and 457. The numbering is "shifted" by four. The access labeling of the lower right (SE) cluster to the VBCs is identical to those of NE cluster.

Similarly, the horizontal block connectors access to the NW cluster is identical to those of the NE cluster and the SW cluster is identical to the SE cluster while the horizontal block connectors access to the SW cluster is shifted by four compared with those of NW cluster.

In the currently preferred embodiment, sixteen block connectors are used per logical block (i.e. four clusters, or a 4×4 cell array). Adding a level 1 MLA routing network allows for the connectability for a block cluster (an 8×8 cell array). Adding level 2 MLA routing network increases the connectability to a block sector (16×16 cell array). Additional levels of MLA routing network increases the number of block sectors by factors of four while the length (or reach) of each line in the MLA routing network increases by factors of two. The number of routing lines in the level 2 MLA is increased by a factor of two; since the number of block sectors increased by a factor of four, on a per unit area basis, the number of routing lines in the next level of hierarchy actually decreases by a factor of two.

Figure 5A:
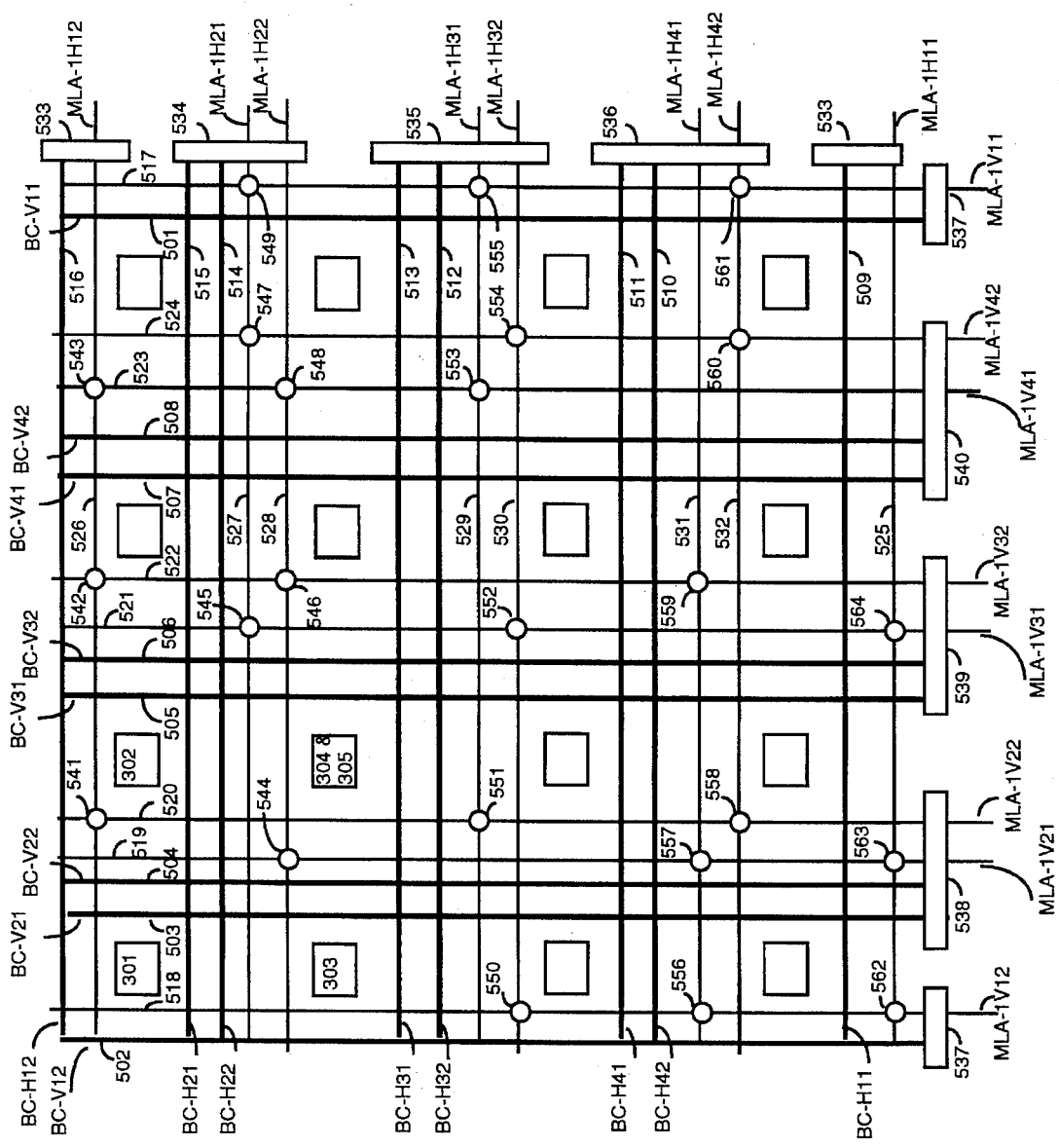
FIG. 5A shows the eight block connector to level 1 MLA exchange networks associated with a logical block and level 1 MLA turn points.

FIG. 5A shows a logical block with associated sixteen block connectors and level 1 MLA routing lines associated with the logical block. The sixteen block connectors 501–516 are depicted by heavy lines whereas the sixteen level 1 MLA routing network lines 517–532 are depicted by lighter lines. Note that the length or span of the block connectors terminates within the logical block while the length of the level 1 MLA routing network lines extends to neighboring logical blocks (twice the length of the block connectors).

Both block connectors and level 1 MLA routing network lines are subdivided into horizontal and vertical groups: vertical block connectors 501–508, horizontal block connectors 509–516, vertical level 1 MLA routing network lines 517–524, and horizontal level 1 MLA routing network lines 525–532.

Figure 5C:
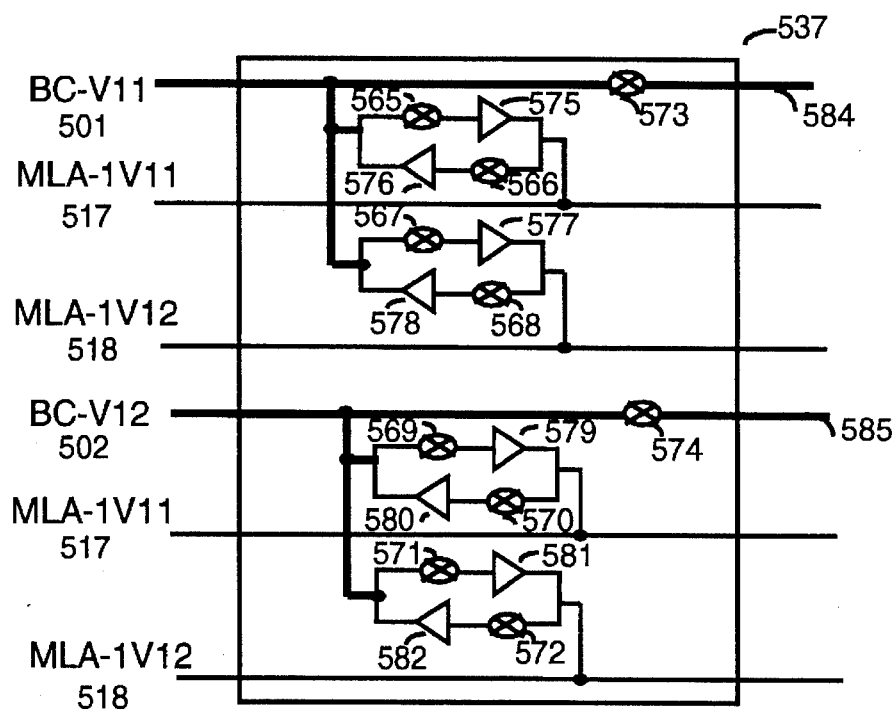
FIG. 5C shows an exchange network.
Figure 5B:
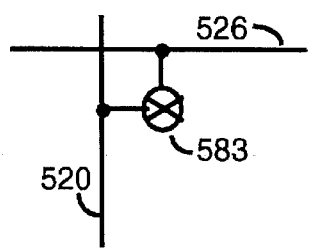
FIG. 5B shows a level 1 MLA turn point.

In the currently preferred embodiment, there are twenty four level 1 MLA turn points for the sixteen level 1 MLA routing network lines within the logical block. In FIG. 5A, the twenty four turn points are depicted as clear dots 541–564. A MLA turn point is a programmable bi-directional passgate for providing connectability between a horizontal MLA routing network line and a vertical MLA routing network line. For example, enabling level 1 MLA turn point 541 causes the horizontal level 1 MLA routing network line 526 and vertical level 1 MLA routing network line 520 to become connected together. FIG. 5B shows level 1 MLA turn point 541. Switch 583 controls whether level 1 MLA routing network line 526 is to be connected to level 1 MLA routing network line 520. If switch is enabled, then level 1 MLA routing network line 526 is connected to level 1 MLA routing network line 520. Otherwise, line 526 is not connected to line 520. Switch 583 is programmable by the user. The turn points are placed as pair-wise groups with the objective of providing switching access connecting two or more block connectors first through the block connector to level 1 MLA exchange networks and then connecting selected level 1 MLA routing lines by enabling the switches. The level 1 MLA lines are used to connect those block connectors that reside in separate logical blocks within the same block cluster.

Referring back to FIG. 5A, there are eight block connector to level 1 MLA exchange networks 533–540 for each logical block. These exchange networks operate to connect certain block connectors to level 1 MLA lines as programmed by the user. FIG. 5C shows the exchange network 537 in greater detail. The block connector to level 1 MLA routing exchange network has eight drivers 575–582. These eight drivers 575–582 are used to provide bi-directional drive for the block connectors 501, 502 and level 1 MLA lines 517, 518. For example, enabling switch 565 causes the signal on block connector 501 to be driven by driver 575 onto the level 1 MLA line 517. Enabling switch 566 causes the signal on level 1 MLA line 517 to be driven by driver 576 onto the block connector 501. Enabling switch 567 causes the signal on block connector 501 to be driven by driver 577 onto the level 1 MLA line 518. Enabling switch 568 causes the signal on level 1 MLA line 518 to be driven by driver 578 onto the block connector 501.

Similarly, enabling switch 569 causes the signal on block connector 502 to be driven by driver 579 onto the level 1 MLA line 517. Enabling switch 570 causes the signal on level 1 MLA line 517 to be driven by driver 580 onto the block connector 502. Enabling switch 571 causes the signal on block connector 502 to be driven by driver 581 onto the level 1 MLA line 518. Enabling switch 572 causes the signal on level 1 MLA line 518 to be driven by driver 582 onto the block connector 502. Switch 573 is used to control whether a signal should pass form one block connector 501 to the adjacent block connector 584 belonging to the adjacent logical block.

Likewise, switch 574 is used to control whether a signal should pass form one block connector 502 to the adjacent block connector 585 belonging to the adjacent logical block.

Figure 6:
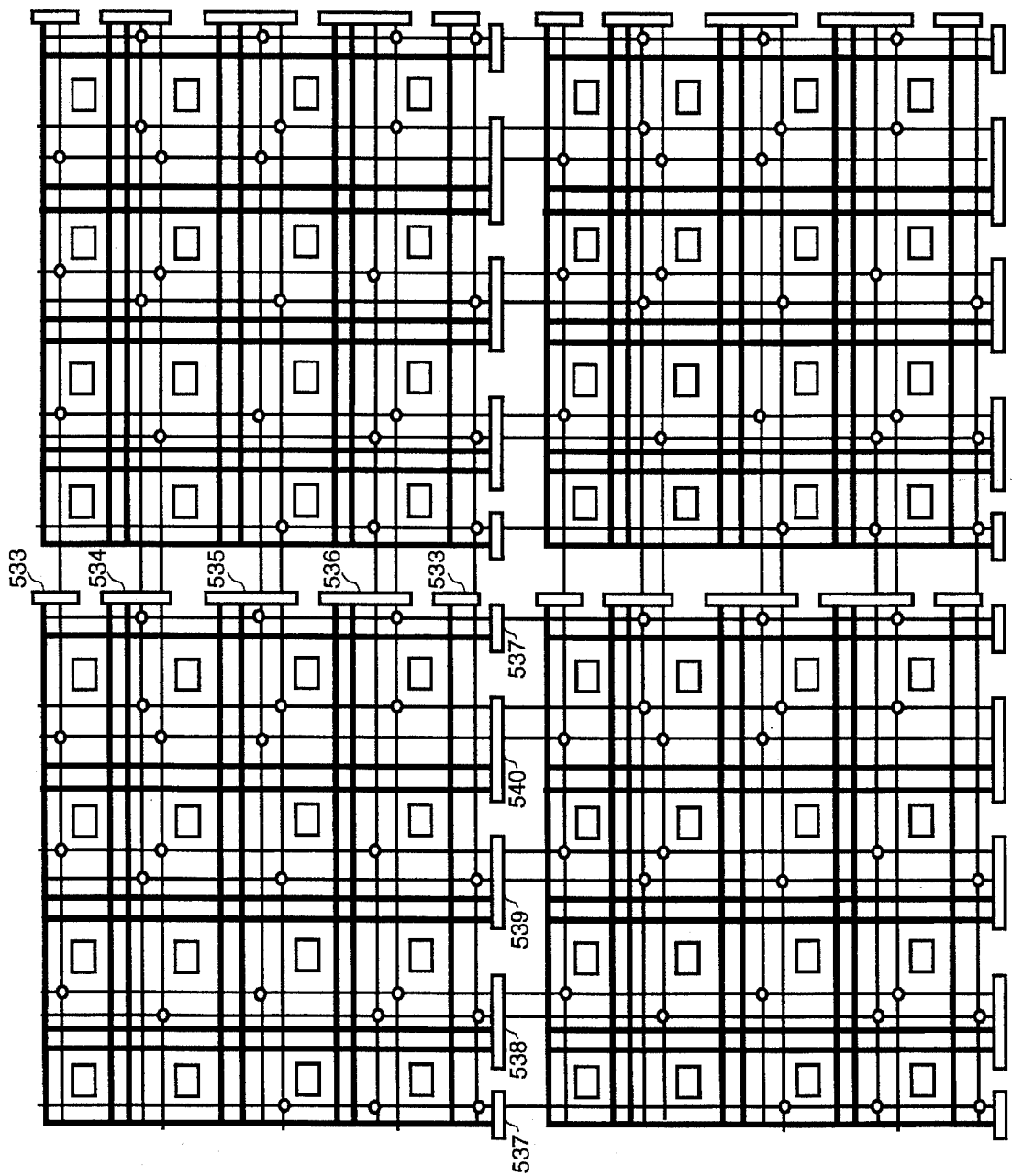
FIG. 6 shows the routing network for a block cluster.

FIG. 6 shows the routing network for a block cluster. The block cluster is basically comprised of four logical blocks which can be interconnected by the level 1 MLA exchange networks 533–540. It can be seen that there are thirty-two level 1 MLA routing network lines.

Figure 7A:
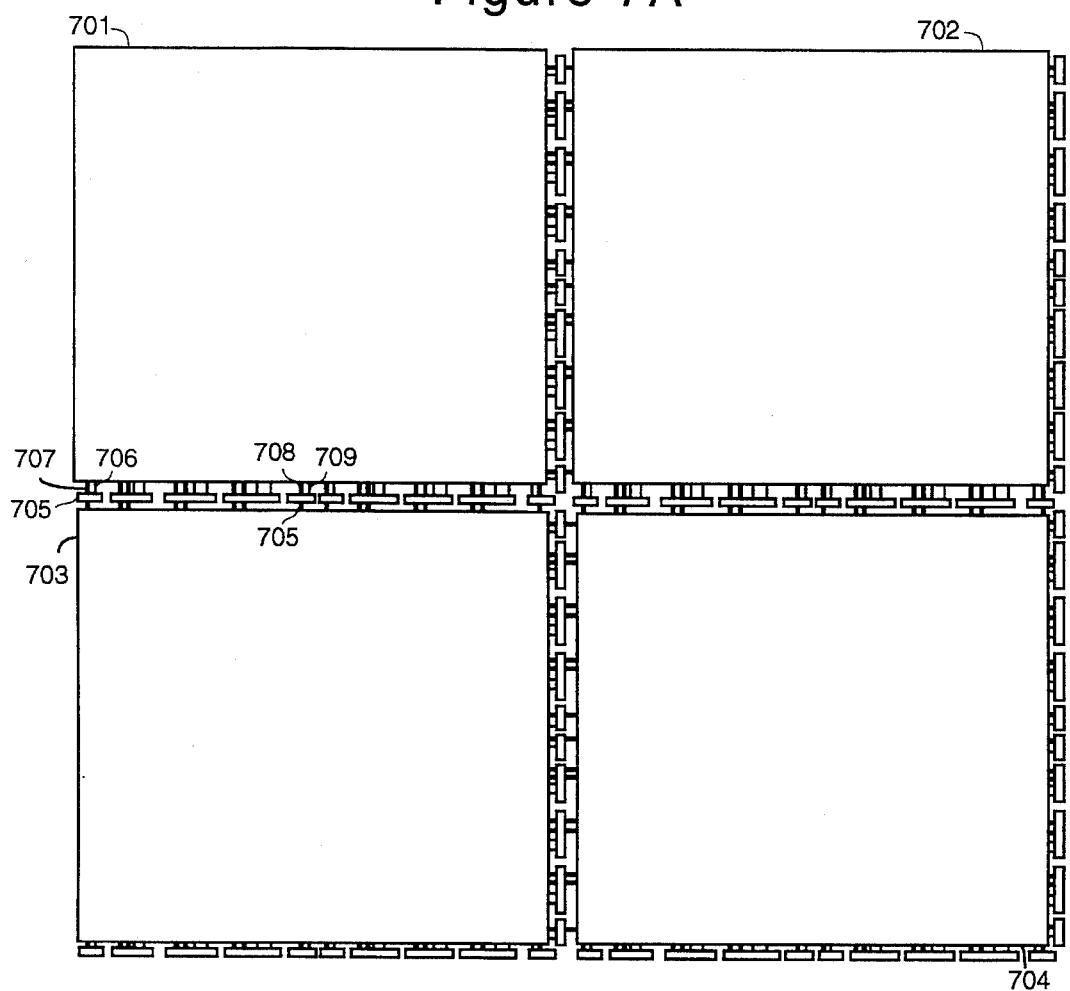
FIG. 7A shows the block diagram of a block sector.

FIG. 7A shows the block diagram for a block sector. The block sector is comprised of four block clusters 701–704. As discussed above, the block clusters are interconnected by block connectors and level 1 MLA routing network lines. In addition, the block sector is also comprised of sixty-four level 2 MLA routing network lines and sixty-four level 2 to level 1 exchange networks to provide connectability between level 1 MLA routing network and level 2 MLA routing network. The level 1 to level 2 MLA routing exchange networks are depicted by rectangles in FIG. 7A. Furthermore, there are forty-eight level 2 MLA turn points associated with each of the four logical blocks within the block sector. Consequently, there are one hundred and ninety-two level 2 MLA turn points for the block sector.

Figure 7B:
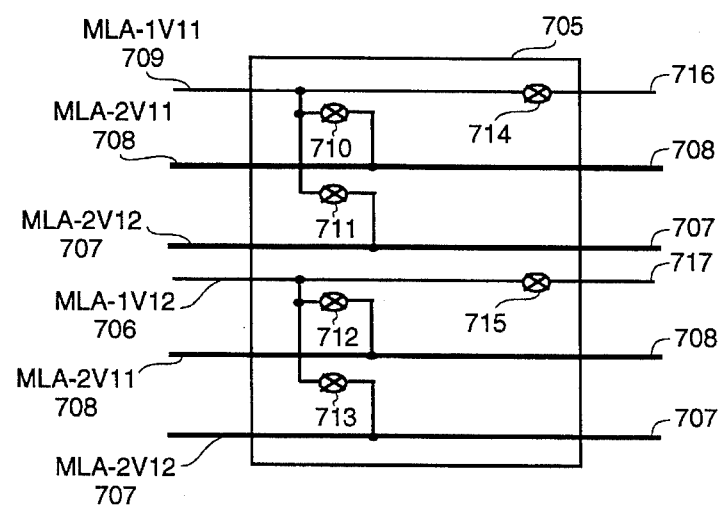
FIG. 7B shows a level 1 to level 2 MLA routing exchange network.

FIG. 7B shows a sample level 1 to level 2 MLA routing exchange network 705. It can be seen that switch 710 is used to control whether a signal should pass between level 1 MLA line 709 and level 2 MLA line 708. Switch 711 is used to control whether a signal should pass between level 1 MLA line 709 and level 2 MLA line 707. Switch 712 is used to control whether a signal should pass between level 1 MLA line 706 and level 2 MLA line 708. Switch 713 is used to control whether a signal should pass between level 1 MLA line 706 and level 2 MLA line 707. Switch 714 is used to control whether a signal should pass form one level 1 MLA line 709 to the adjacent level 1 MLA line belonging to the adjacent block duster. Likewise, switch 715 is used to control whether a signal should pass form one level 1 MLA line 706 to the adjacent level 1 MLA line 715 belonging to the adjacent block cluster.

Figure 8A:
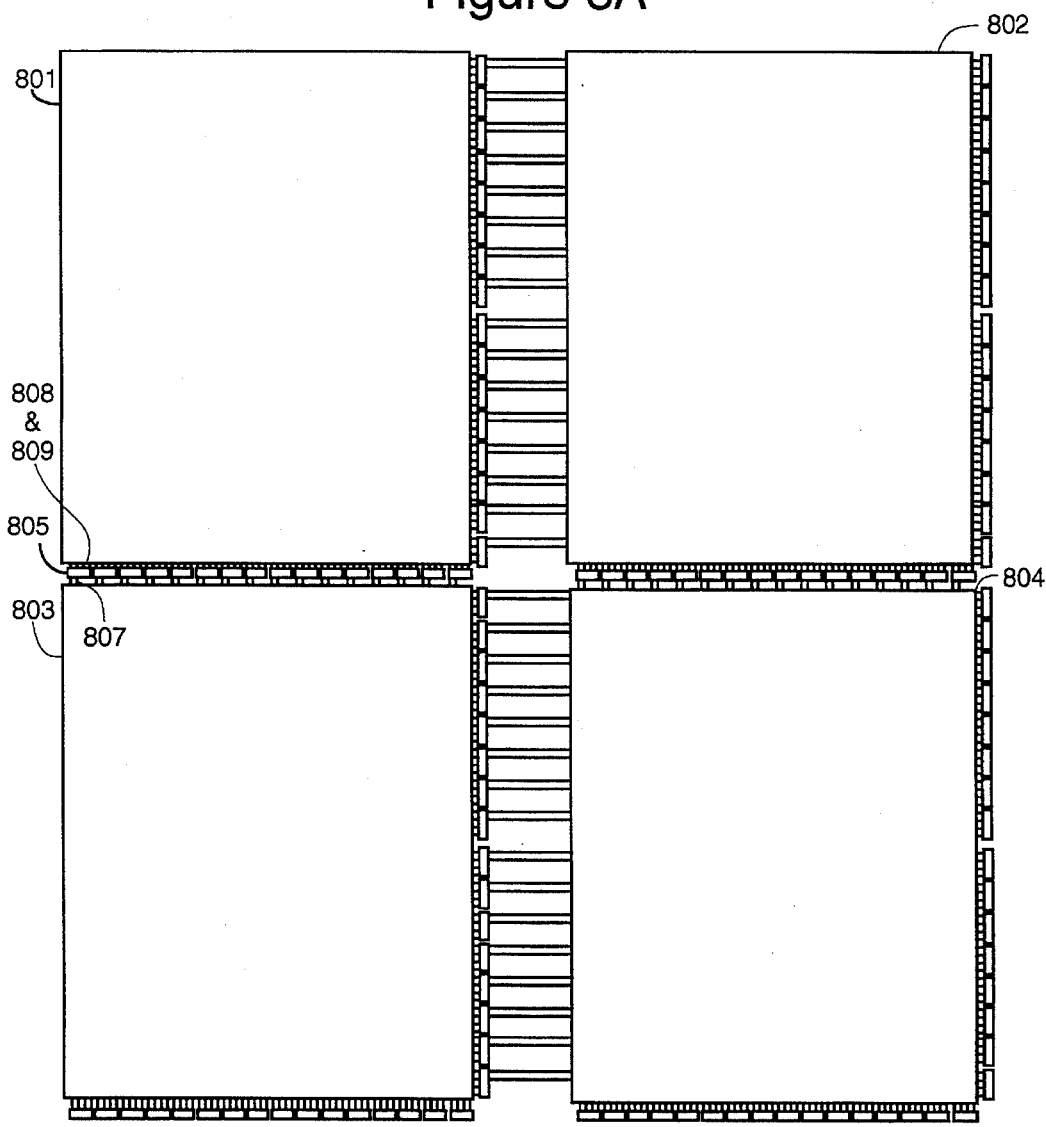
FIG. 8A shows a sector cluster.

FIG. 8A shows a sector cluster. The sector cluster is comprised of four block sectors 801–804 with their associated block connectors, level 1, and level 2 MLA routing network lines and exchange networks. In addition, there are one hundred and twenty-eight level 3 MLA routing network lines, providing connectability between the level 2 MLA lines that belong to different block sectors 801–804 within the same sector cluster 800. There are ninety-six level 3 MLA turn points associated with the level 3 MLA lines for each of the block sector 801–804 (i.e. three hundred and eighty-four total level 3 MLA turn points for the sector cluster). Furthermore, there are thirty-two level 2 to level 3 MLA routing exchange networks associated with each of the four block sector 801–804. Hence, there are total of one hundred and twenty-eight level 3 MLA routing exchange network for providing programmable connectability between the various level 2 and level 3 MLA lines.

Figure 8B:
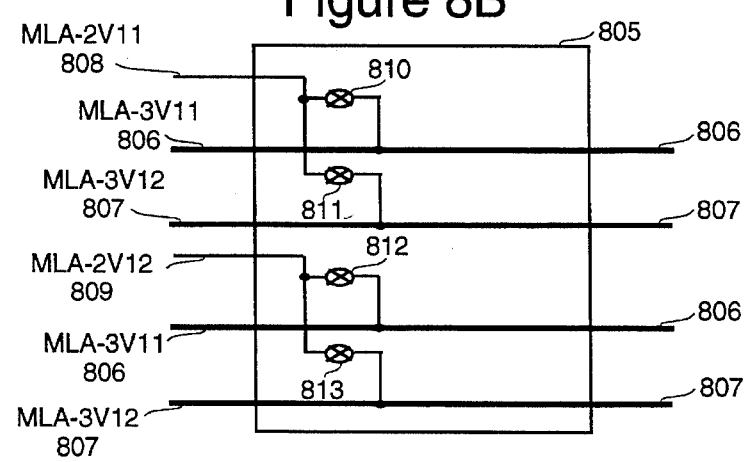
FIG. 8B shows a level 2 to level 3 MLA routing exchange network.

FIG. 8B shows an example of a level 2 to level 3 MLA routing exchange network 805. It can be seen that enabling switch 810 causes a signal on the level 2 MLA line 808 to be connected to the level 3 MLA line 806. Disabling switch 810 disconnects the level 2 MLA line 808 from the level 3 MLA line 806. Enabling switch 811 causes a signal on the level 2 MLA line 808 to be connected to the level 3 MLA line 807. Disabling switch 811 disconnects the level 2 MLA line 808 from the level 3 MLA line 807. Likewise, enabling switch 812 causes a signal on the level 2 MLA line 809 to be connected to the level 3 MLA line 806. Disabling switch 812 disconnects the level 2 MLA line 809 from the level 3 MLA line 806. Enabling switch 813 causes a signal on the level 2 MLA line 809 to be connected to the level 3 MLA line 807. Disabling switch 813 disconnects the level 2 MLA line 809 from the level 3 MLA line 807.

In the present invention, larger and more powerful FPGAs can be achieved by adding additional logic sector clusters which are connected by additional levels of MLA routing networks with the corresponding MLA turn points and exchange networks.

In one embodiment of the present invention, each of the five I-Matrix lines (331–335, FIG. 3A) can be extended to provide connectability between two adjacent I-Matrix lines belonging to two different clusters. The passgate switches 336–340, 341–345, 346–350, and 351–355 in FIG. 3B are examples of four different sets of I-Matrix line extension switches. This provides further flexibility by providing the capability of routing a signal between two adjacent clusters without having to be routed through the use of block connectors.

Similarly, block connectors can be extended to provide connectability between two adjacent block connectors belonging to two different logical blocks. Switch 573 of FIG. 5C illustrates such block connector extension connecting block connector 501 to block connector 584 through switch 573. This provides further flexibility by providing the capability of routing a signal between two adjacent logical blocks without having to be routed through the level 1 MLA lines and associated MLA exchange networks. This concept can be similarly applied to the level 1 MLA lines as well. Switch 714 of FIG. 7B shows an example where level 1 MLA line 709 is extended to connect to level 1 MLA line 716 by enabling switch 714. This provides further flexibility by providing the capability of routing a signal between two adjacent block clusters without having to be routed through the level 2 MLA lines and associated MLA exchange networks.

Thus, an architecture with an intraconnect and interconnect scheme for programmable logic circuits is disclosed.

What is claimed is:

1. A programmable logic circuit comprising:

an input means for inputting a signal to said programmable logic circuit;

a plurality of cells coupled to said input means, each of said cells capable of performing a digital function to said signal;

a first set of routing lines for coupling a plurality of cells to form logical clusters of cells, wherein each output of each of said cells of each logical cluster can be programmably coupled to at least one input of each of the other cells of said logical cluster, each of said cells of said logical cluster is further programmably coupled through the first set of routing lines to at least one input of each of the other cells of other logical clusters of cells;

a second set of routing lines for coupling a plurality of logical clusters to form a logical block of logical clusters of cells, wherein each input and each output of every cell of said logical block can be programmably coupled to said second set of routing lines;

a first set of switches for coupling an output of one cell of a first logical cluster to an input of at least one cell of said first logical cluster by selecting one routing line of said first set of routing lines associated with said first logical cluster;

a second set of switches for coupling outputs or inputs of said cells of a first logical block to said routing lines said associated second set of routing lines, wherein said second set of switches can be used to couple one routing line of said second set of routing lines to another routing line of said second set of routing lines;

a third set of switches for coupling one routing line of said first set of routing lines of said first logical cluster to an adjacent routing line of said first set of routing lines of an adjacent second logical cluster; and a fourth set of switches for coupling one routine line of said second set of routing lines of said first logical block to an adjacent routing line of said second set of routing lines of an adjacent second logical block.

2. The programmable logic circuit of claim 1, wherein at least one output of said cells of said logical cluster can be programmably coupled to at least one input of said cells of said logical cluster.

3. The programmable logic circuit of claim 1, wherein said second set of routing lines can be programmably selected to conduct either output signals or input signals.

4. The programmable logic circuit of claim 1 further comprising:

a plurality of inverting and non-inverting drivers coupled to each of said cells for inverting input signals to said cells;

a plurality of programmable switches for determining whether said input signals to said cells are to be routed through said drivers.

5. The programmable logic circuit of claim 4, wherein said first set of switches, said second set of switches, said third set of switches, said fourth set of switches, and said plurality of programmable switches are comprised of programmable passgates.

6. The programmable logic circuit of claim 5, wherein said logical cluster includes four two-input combination logic and a flip-flop.

7. The programmable logic circuit of claim 6, wherein said logical block includes four of said logical clusters, each of said logical clusters is comprised of at least four of said cells.

8. The programmable logic circuit of claim 7, wherein additional sets of logical blocks are interconnected by additional sets of hierarchical routing networks.

9. The programmable logic circuit of claim 8, wherein said first set of routing lines and said second set of routing lines are comprised of one-bit wide bi-directional data buses.

10. The programmable logic circuit of claim 9 further comprising a plurality of drivers for bi-directionally driving said data buses.

11. The programmable logic circuit of claim 10, wherein said circuit is implemented by at least one of SRAM, DRAM, fuse, anti-fuse, ferroelectric, EEPROM, EPROM, and FLASH processes.

12. The programmable logic circuit of claim 1, wherein a number of routing lines of the first set of routing lines is greater than the number of cells of the logical cluster.

13. A field programmable gate array comprising:

an input/output interface for inputting signals to said field programmable gate array and for outputting signals from said field programmable gate array;

a plurality of logical clusters of cells coupled to said input/output interface, said cells performing digital processing on signals input to said field programmable gate array;

a plurality of block connectors for coupling inputs and outputs of cells of one of said plurality of logical clusters to inputs and outputs of cells of another of said plurality of logical clusters, wherein at least two of said plurality of logical clusters are associated with a same logical block;

a first set of switches for programmably coupling outputs or inputs of said cells of said logical block to said block connectors;

a plurality of a first level of routing network lines for coupling inputs and outputs of cells of one of said logical blocks to inputs and outputs of cells of another of said logical blocks;

a second set of switches for programmably coupling routing network lines of said plurality of first level routing network lines;

a plurality of a second level of routing network lines for coupling a first routing network line of said plurality of first level routing network lines to a second routing network line of said plurality of first level routing network lines;

a third set of switches for programmably coupling routing network lines of said plurality of second level routing network lines;

a plurality of a third level of routing network lines for coupling a first routing network line of said plurality of second level routing network lines to a second routing network line of said plurality of second level routing network lines;

a fourth set of switches for programmably coupling routing network lines of said third level routing network lines;

a fifth set of switches for programmably coupling at least one routing network line of said plurality of first level routing network lines to one network routing line of said plurality of second level routing network lines;

a sixth set of switches for programmably coupling at least one routing line of said second level routing network lines to one routing network line of said plurality of third level routing network lines.

14. The field programmable gate array of claim 13 further comprising:

a plurality of intraconnections for coupling an output of one of said cells to at least one input of other cells of a same logical cluster;

a seventh set of switches for programmably controlling said intraconnections of said logical clusters.

15. The field programmable gate array of claim 14 further comprising:

a plurality of inverting and non-inverting drivers coupled to inputs of said cells;

an eighth set of switches for programmably routing signals through said drivers before being input to said cells.

16. The field programmable gate array of claim 15, wherein said first, said second, said third, said fourth, said fifth, said sixth, said seventh, and said eighth set of switches are comprised of bi-directional passgates.

17. The field programmable gate array of claim 16, wherein said first, said second, and said third level of routing networks are comprised of one-bit wide, bi-directional data buses.

18. The field programmable gate array of claim 17 further comprising a plurality of drivers for driving said data buses, wherein said drivers can drive said data buses bi-directionally.

19. The field programmable gate array of claim 18, wherein said gate array is implemented by at least one of SRAM, DRAM, fuse, anti-fuse, ferroelectric, EEPROM, EPROM, and FLASH processes.

20. A field programmable gate array comprising:

an I/O providing a signal interface for said field programmable gate array;

a plurality of cells coupled to said I/O, said cells digitally processing input signals to said field programmable gate array;

a plurality of sets of block connectors for coupling said plurality of cells, wherein each set of block connectors provides coupling for a logical block comprising a 4×4 cell array;

a first set of switches for programmably coupling block connectors corresponding to each set of block connectors associated with said logical block;

a plurality of sets of a first level routing network for coupling said plurality of sets of block connectors, wherein each set of said first level routing network lines provides coupling for a block cluster comprising an 8×8 cell array;

a second set of switches for programmably coupling routing network lines corresponding to each set of said first level routing network;

a second level routing network for coupling said plurality of sets of said first level routing network, wherein said second level routing network line provides coupling for a block sector comprising a 16×16 cell array;

a third set of switches for programmably coupling routing network lines corresponding to each set of said second level routing network;

a fourth set of switches for programmably coupling block connectors corresponding said set of block connectors to routing network lines corresponding to said first level routing network;

a fifth set of switches for programmably coupling routing network lines corresponding the said first level routing network to routing network lines corresponding to said second level routing network;

21. The field programmable gate array of claim 20 further comprising:

a plurality of intraconnection matrix lines providing coupling for a logical cluster comprising a 2×2 cell array;

a sixth set of switches for programmably controlling said intraconnection matrix lines, wherein each output of each cell of said logical cluster can be programmably connected to at least one input of each of the other cells of said logical cluster and at least one input of an output cell.

22. The field programmable gate array of claim 21 further comprising:

a plurality of drivers for driving signals prior to input to said cells wherein said drivers can be either inverting or non-inverting;

a seventh set of switches for programmably controlling which of said signals are to be routed through said drivers.

23. The field programmable gate array of claim 22, further comprising an eighth set of switches for programmably coupling block connectors corresponding to a first set of block connectors to block connectors corresponding to a second set of block connectors.

24. The field programmable gate array of claim 23 further comprising a ninth set of switches for programmably coupling routing network lines corresponding to a first set of said first level routing network to routing network lines corresponding to a second set of said first level routing network.

25. The field programmable gate array of claim 24 further comprising additional levels of routing networks, wherein said cell arrays are increased by a factor of four for each additional level of routing networks and the number of routing network lines are increased by a factor of two for each additional level of routing networks.

26. The field programmable gate array of claim 25, wherein said additional levels of routing network lines and said cell arrays can be sized with partial levels of routing network lines.

27. The field programmable gate array of claim 25, wherein said block connectors, said first level of routing network lines, and said second level of routing network lines are bi-directional.

28. The field programmable gate array of claim 27, wherein said first, said second, said third, said fourth, said fifth, said sixth, said seventh, said eighth, and said ninth sets of switches are comprised of programmable, bi-directional passgates.

29. A method of processing signals in a field programmable gate array, comprising the steps of:

inputting a signal to said field programmable gate array;

coupling a plurality of cells together, said cells digitally processing signals input to said field programmable gate array;

providing a plurality of intraconnection matrix lines for coupling a logical cluster comprising a set of said plurality of cells;

programmably controlling said intraconnection matrix lines, wherein each output of each cell of said logical cluster can be programmably coupled to at least one input of each of the other cells of said logical cluster;

providing coupling for a logical block comprising a set of said logical clusters by a plurality of block connectors;

programmably connecting block connectors corresponding to each set of block connectors associated with said logical block;

coupling said plurality of sets of block connectors by a plurality of sets of a first level routing network lines, wherein each set of said first level routing network lines provides coupling for a block cluster;

programmably connecting routing network lines corresponding to each set of said first level routing network lines;

providing a second level routing network lines for coupling said plurality of sets of said first level routing network lines, wherein said second level routing network lines provides coupling for a block sector comprising a cell array comprising a set of said block clusters;

programmably connecting routing network lines corresponding to each set of said second level routing network lines;

programmably connecting said block connectors corresponding the said set of block connectors to routing network lines corresponding to said first level routing network lines;

programmably connecting routing network lines corresponding the said first level routing network lines to routing network lines corresponding to said second level routing network lines;

programmably connecting block connectors corresponding to a first set of block connectors to block connectors corresponding to a second set of block connectors;

programmably connecting routing network lines corresponding to a first set of said first level routing network lines to routing network lines corresponding to a second set of said first level routing network lines.

30. The method of claim 29 further comprising the steps of:

implementing additional levels of routing network lines, wherein said cell arrays are increased by a factor proportion to an area increase of said cell arrays for each additional levels of routing network lines, the number of said routing network lines are increased by a factor proportional with the length increase of the said cell arrays for each additional levels of routing network lines;

implementing additional set of switches for programmably connecting routing network lines corresponding to each set of said additional level routing network lines and for programmably connecting routing network lines corresponding to a first set of said additional level routing network lines to routing network lines corresponding to a second set of said level routing network lines that is one level below the hierarchy of said additional level routing network lines.

31. The method of claim 30, wherein said additional levels of routing network lines and said cell arrays can be sized with partial levels of routing network lines, depending upon the cell array size.

32. The method of claim 30, wherein said block connectors, said first level of routing network lines, said second level of routing network lines, and additional levels of routing network lines, are bi-directional.

33. The method of claim 30, wherein said first, said second, said third, said fourth, said fifth, said sixth, said seventh, said eighth, and said additional sets of switches are comprised of programmable, bi-directional passgates.

34. The method in accordance with claim 30 further comprising the step of adding levels of routing networks, wherein new cell arrays are increased by a factor proportional to an area increase of said cell arrays and for each additional level of routing network lines, the number of said routing network lines are increased by a factor proportional with the length increase of said cell arrays.

35. In a programmable logic circuit having a plurality of cells for digitally processing electrical signals, a method of connecting said plurality of cells to process signals input to said programmable logic circuit according to logic functions defined by a user, said method comprising the steps of:

forming a logical cluster by providing a first set of intraconnection lines for coupling a set of said cells, wherein each output of each of said cells of said logical cluster can be programmably coupled to at least one input of each of the other cells of said logical cluster, said first set of intraconnecting lines further providing interconnection of cells of logical clusters by programmably coupling to at least one input of other cells of other logical clusters;

forming a logical block by providing a second set of block connectors for coupling a set of logical clusters, wherein each input and each output of every cell of said logical block can be programmably coupled to said second set of block connectors;

selecting one of said intraconnection lines of said first set of intraconnection lines corresponding to a first logical cluster;

controlling a first switch to couple an output of one cell of said first logical cluster to an input of another cell of said first logical cluster;

controlling a second switch to couple an input or output of one of said cells of a first logical block to a block connector of said second set of block connectors;

controlling third switch for coupling one intraconnection line of said first set of intraconnection lines corresponding to said first logical cluster to an adjacent intraconnection line of said first set of intraconnection lines of an adjacent second logical cluster;

controlling a fourth switch for coupling one block connector of said second set of block connectors corresponding to said first logical block to an adjacent block connector of said second set of block connectors of an adjacent second logical block.

36. The method of claim 35 further comprising the step of controlling fifth switch to couple an output of one of said cells of one of said logical clusters to at least one input of one of said cells of said one of said logical clusters.

37. The method of claim 35 further comprising the step of selecting whether said second set of block connectors are to conduct input signals or output signals.

38. A field programmable gate array comprising: an input/output interface for inputting signals to, and outputting signals from, the programmable gate array;

a plurality of blocks comprising arrays of cells, said cells performing digital processing on signals input to the field programmable gate array;

a plurality of first level routing network lines;

a plurality of block connectors for coupling inputs and outputs of cells of each block to first level routing network lines;

a first set of switches coupled between outputs ands inputs of the cells of each block and the block connectors for programmably coupling the outputs or inputs of said cells of said logical block to said block connectors;

a second set of switches for programmably coupling first level routing network lines to block connectors;

a third set of switches for programmably coupling together first level routing network lines;

a plurality of higher levels of routing network lines, each higher level of routing network lines comprising a number of lines, said lines having a length, each higher level of routing network lines programmably coupling a higher level group of cell arrays, the number of cell arrays of the higher level group increased from a number of cell arrays of a previous lower level group by a first factor, the length of the lines of the higher level routing network lines being increased to span an area defined by the higher level group, and the number of lines of the higher level of routing network lines being increased proportionally by a second factor from a number of lines of a previous lower level routing network lines;

a plurality of higher level switches comprising a first set and second set of switches for each higher level of routing network lines, said first set of switches for programmably coupling at least one line of a higher level routing network lines to at least one other line of the higher level routing network lines and the second set of switches for programmably coupling at least one line of the higher level routing network lines to at least one line of a previous lower level routing network lines;

wherein each higher level of routing network lines increases the length of routing lines but decreases the number of lines per unit area.

39. The field programmable gate array as set forth in claim 38, wherein the first factor equals two and the second factor equals two.

40. The field programmable gate array as set forth in claim 38, wherein the first factor equals two and the second factor equals a value in the range between and including one and two.

* * * * *

UNITED STATES PATENT AND TRADEMARK OFFICE
CERTIFICATE OF CORRECTION

PATENT NO.   : 5,457,410
DATED        : October 10, 1995
INVENTOR(S)  : Benjamin J. Ting It is certified that error appears in the above-identified patent and that said Letters Patent is hereby corrected as shown below:

In column 1 at line 45 delete "tristatable" and insert --tri-statable--

In column 12 at line 22 insert --716-- between "line" and "belonging"

In column 12 at line 23 delete "duster" and insert --cluster--

In column 13 at line 66 delete "routine" and insert --routing--

Signed and Sealed this

Sixteenth Day of November, 1999

Attest:

Q. TODD DICKINSON

*Attesting Officer*    *Acting Commissioner of Patents and Trademarks*

Adverse Decision in Interference

Patent No. 5,457,410, Benjamin S. Ting, ARCHITECTURE AND INTERCONNECT SCHEME FOR PROGRAMMABLE LOGIC CIRCUITS, Interference No. 103,833, final judgment adverse to the patentee rendered July 18, 2000, as to claims 1-40.

*(Official Gazette February 13, 2001)*